(12) United States Patent
Matsumoto

(10) Patent No.: US 6,339,388 B1
(45) Date of Patent: Jan. 15, 2002

(54) MIXED ANALOG AND DIGITAL INTEGRATED CIRCUIT AND TESTING METHOD THEREOF

(75) Inventor: Hiroshi Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/679,802

(22) Filed: Jul. 15, 1996

Related U.S. Application Data

(62) Division of application No. 08/520,128, filed on Aug. 28, 1995, now Pat. No. 5,617,037.

(30) Foreign Application Priority Data

Aug. 31, 1994 (JP) .............................................. 6-206436

(51) Int. Cl.[7] .................................................. H03M 1/10
(52) U.S. Cl. ........................ 341/120; 341/115; 341/118; 324/158.1
(58) Field of Search ................................ 341/120, 118, 341/115; 324/620, 158.1; 371/22.1

(56) References Cited

U.S. PATENT DOCUMENTS

| 4,707,654 A | 11/1987 | Suzuki et al. ........... 324/158 R |
| 4,922,492 A | 5/1990 | Fasang et al. ............... 371/221 |
| 5,097,205 A | 3/1992 | Toyoda ................... 324/158 R |
| 5,184,162 A | 2/1993 | Saitoh et al. ........... 324/158 R |
| 5,239,536 A | 8/1993 | Masuko et al. ............... 370/15 |
| 5,594,612 A | * 1/1997 | Henrion ...................... 341/120 |

FOREIGN PATENT DOCUMENTS

| JP | 1-138478 | 5/1989 |
| JP | 2-19780 | 1/1990 |

* cited by examiner

*Primary Examiner*—Peguy JeanPierre
(74) *Attorney, Agent, or Firm*—Young & Thompson

(57) ABSTRACT

The constitution of mixed analog/digital integrated circuits and their testing methods are disclosed. These testing methods are aimed at verification and the linearity of D/A and A/D converters. The mixed analog/digital integrated circuit is given a constitution in which a D/A circuit and an A/D circuit are connected in series to verify the reveribility of the D/A circuit and the A/D circuit, and an attenuator is inserted after D/A conversion and a multiplier with multiplying factor equal to the reciprocal of the attenuation factor of the attenuator is inserted in the post-stge of the A/D converter.

11 Claims, 5 Drawing Sheets

MIXED ANALOG AND DIGITAL INTEGRATED CIRCUIT AND TESTING METHOD THEREOF

This application is a divisional of application Ser. No.08/520,128, filed Aug. 28, 1995, now U.S. Pat. No. 5,617,037.

BACKGROUND OF THE INVENTION

1. Field of the Invention

The present invention relates to an integrated circuit in which an analog circuit and a digital circuit are mixed and further to a testing method thereof.

2. Description of the Prior Art

In recent years, the analog/digital mixed circuit technology in which an analog circuit and a digital circuit are integrated to form one chip has been considered to enhance the performances of an integrated circuit. In this case, it is necessary to test the actually fabricated semiconductor chip whether it can achieve desired functions/operations by using an LSI tester. That is, it is required to test the operations of wont only the analog circuit but the digital circuit.

Since, however, the conventional LSI tester for digital circuit is so constructed as to put emphasis only on the value of the logical signal and the timing of its appearance and cannot take its output waveform into consideration, an LSI tester dedicated to testing an analog circuit is required. As such an apparatus, one may point out two types, namely, an LSI tester which exclusively verifies only analog circuits, and an LSI tester for analog and digital circuits which can handle both the analog signal and the digital signal.

In the former apparatus, the digital test and the analog test have to be executed separately for the respective circuits, requiring tests repeated twice. Moreover, the whole circuit has to be constructed so as to permit separation of the digital circuit from the analog circuit, so that it brings about an increase in the chip area and the number of terminals. A configuration of a mixed analog/digital circuit which suppresses such a disadvantage to a possible minimum and increases the observability and the controllability is disclosed in, for example, Japanese Patent Application Laid Open No. 2-19780 (1990). However, in this configuration, an analog tester is absolutely necessary, and the need for twice tests remains unchanged.

In the latter, it is necessary to take the output waveform, in addition to the function of the digital tester, into consideration so that the LSI tester becomes expensive and the number of available testers has to be cut down drastically due to the cost. Because of this, the testing time and the testing cost for a chip of mixed analog and digital circuits are increased drastically compared with the case of a chip lacking the analog circuit, and one finds himself to be on the horns of a dilemma of imparting an added value and rise in the cost. Therefore, if a mixed chip of analog and digital circuits can also be tested using a digital tester alone, it will be extremely advantageous.

From such a viewpoint, a mixed analog/digital circuit as disclosed in, for example, Japanese Patent Application Laid Open No. 1-138478 (1989) has been proposed in the past.

Referring to FIG. 6 showing a circuit configuration essentially equivalent to the above, a circuit constituted of a digital circuit 62 and a D/A converter 64 connected to the output of the digital circuit 62 is imagined in this circuit, wherein the function of outputting an analog signal is added to the ordinary function of the digital circuit.

In order to execute the test of this circuit with a digital tester, the analog output is further split into two parts, where an A/D converters 63 is connected to one of them to reconvert the analog output to get a digital signal again. If both the D/A converter 64 and the A/D converter 63 which is an additive function dedicated to the test are operating normally, a digital signal x immediately before D/A conversion and a digital signal z immediately after A/D conversion should be strictly equal, therefore, the test is accomplished by detecting the equivalence.

However, if the relation between the digital signal x and a signal y which is the result of its D/A conversion is represented by $y=f(x)$, and the relation between the A/D converted signal z and the signal y is represented by $z=g(y)$, then it follows that $z=g(f(x))$. The testing technique of the prior art shown in FIG. 6 is aimed only at the verification of whether g is the inverse function of f, and is not aimed at ensuring the validity as an A/D converter and a D/A converter, namely, their linearity.

In the extreme case in which the data bus of the signal x and the data bus of the signal z are short-circuited, there is a possibility of letting the products pass the test as nondefective no matter what the signal y may be. Moreover, since it provides only the testing method of the D/A converter 64 on the output side, application of this testing method to a general analog/digital mixed integrated circuit was difficult.

SUMMARY OF THE INVENTION

It is therefore an object of this invention to provide a mixed analog/digital integrated circuit and a testing method thereof in which a test such as the verification of respective linearities of the installed A/D converter and D/A converter can be performed by itself.

An integrated circuit comprising, on a single semiconductor chip, a D/A converter receiving first digital data and converting said first digital data into a first analog signal having a first amplitude representative of a first value of said first digital data, first means operatively coupled to said D/A converter to receive said first analog signal for producing a second analog signal having a second amplitude that is K times as large as said first amplitude, said K being other than one, an A/D converter operatively receiving said second analog signal and converting said second analog signal into a second digital data having a second value representative of said second amplitude of said second analog signal, second means operatively coupled to said A/D converter to receive said second digital data for producing third digital data having a third value that is 1/K times as large as said second value of said second digital data, and a comparator operatively coupled to receive said first and third digital data and comparing said first digital data with said third digital data.

It is preferable to constitute the first means by an attenuator. In this arrangement, the output of the D/A converter is supplied to the attenuator whose output is the supplied to the A/D converter. The output of the A/D converter is amplified in digital value by a multiplier as the second means. The output of the multiplier and the input of the D/A converter are finally compared with each other by the digital comparator. If the attenuation factor is $1/(0<\alpha<1)$, the multiplication factor is $\alpha$.

Assume that the relation between a digital signal x input to the D/A converter and the analog signal y output by the D/A converter is represented by $y=f(x)$, and that the relation between the analog signal y input to the A/D converter and a digital signal z output by the A/D converter is represented by $z=g(y)$.

The test according to the present invention is as follows. First, the analog multiplier and the digital multiplexer are set so that the analog signal from the D/A converter is transmitted directly to the A/D converter whose output is then compared with the input of the D/A converter. Mathematically speaking, it will be tested whether the relation $$x=g(f(x))$$

holds for all x. If it is valid, then the relation $$g \cdot f=1,$$

that is, $$f=g^{-1},$$

turns out to be verified. If the above does not hold, the specimen is decided as a defective unit.

If the product passes the first test, it will then be subjected to a second test as described below.

First, the analog multiplexer and the digital multiplexer are set so as to pass the analog signal from the D/A converter through the attenuator which multiplies the signal by X, to be input by the A/D converter, and then, the digital signal from the A/D converter via digital multiplying means which multiplies the signal by $1/\alpha$, is compared with the input signal to the D/A converter. Mathematically speaking, it will be tested whether the relation $$x=(1/\alpha) \cdot g(\alpha \cdot f(x))$$

holds for all x. If it is valid, then the relation $$((1/\alpha) \cdot g) \cdot (\alpha \cdot f)=1,$$

that is, $$\alpha \cdot f=((1/\alpha \cdot g)^{-1}=g^{-1} \cdot \alpha$$

turns out to be verified. Since $f=g^{-1}$ has been verified in the first test, it can be said that the relation $$\alpha \cdot f(x)=f(\alpha \cdot x)$$

holds for all x. Since it can be proven mathematically that the above relation holds only when $f(x)$ linear function which satisfies $$f(x)=\alpha \cdot x.$$

Namely, it is possible to perform the test for the linearity of the D/A converter by using the method described above. Since it can also be deduced that $$g(y)=(1/\alpha) \cdot y,$$

the linearity of the A/D converter can be verified simultaneously.

Using the test method described above, it is possible to test a analog circuit which is neither an A/D converter nor a D/A converter.

Namely, by inputting a digital signal from some kind of digital circuit in the IC or from the outside to the D/A converter whose linearity has just been verified, the output from the converter is sent to an analog circuit (for example, a lowpass filter) which is neither an A/D converter nor a D/A converter. Then the output of the analog circuit is sent to the A/D converter whose linearity has just been verified. Next the correlation between the digital output from the A/D converter and the digital input signal originally transmitted to the D/A converter is analyzed.

It is possible to verify the operation of the analog circuit by judging whether or not the obtained correlation is designed originally.

Each of the analog circuit and the digital circuit generally has a plurality of channels for transferring signals with the outside. In such a case, by switching all of the analog signals input to the analog circuit from the outside to output analog signals from the D/A converter by means of switching using multiplexers, and branching an analog signal output to the outside from the analog circuit into two parts and sending one part to the A/D converter, it becomes possible to prepare all of the inputs to the analog circuit on the digital circuit side and all of the outputs from the analog circuit can be received on the digital circuit side.

By combining the first, second and third tests described just above, the entire verification procedure of the analog circuit can be performed by the digital tester.

In the third test, the D/A converter and the A/D converter are used as, so to speak, a waveform generator and a measuring instrument, respectively, and the essential feature of this invention resides in the fact that the linearity of the A/D converter and the D/A converter verified in the second test gives the ground for their availability as the waveform generator and the measuring instrument.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Figure 1:
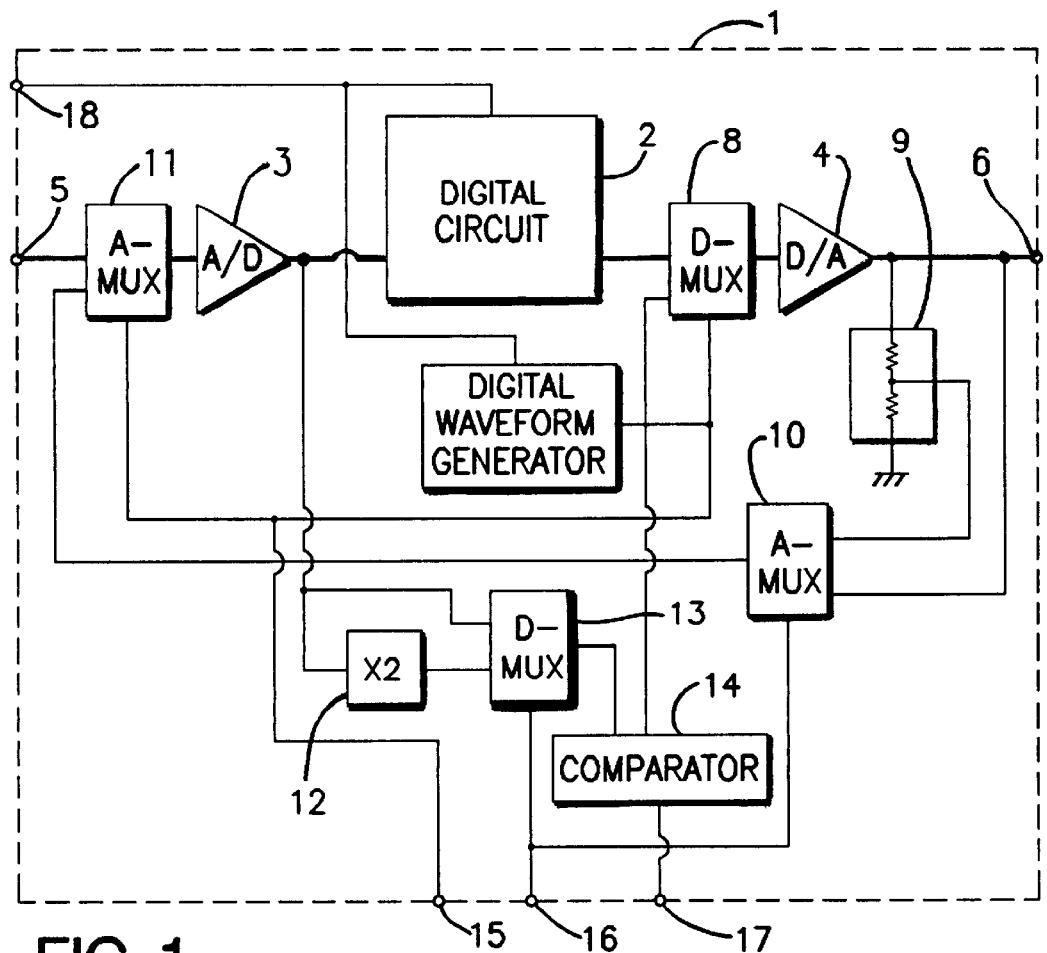
FIG. 1 is a block diagram showing a first embodiment of the mixed analog/digital integrated circuit arranged for the test of the invention.

FIG. 1 is a block diagram showing the configuration of the first embodiment of the mixed analog/digital integrated circuit of this invention.

In the mixed analog/digital integrated circuit 1 of this embodiment, all the digital processings in the integrated circuit 1 are carried out by means of a digital circuit 2. This circuit has a constitution in which an analog input is input from an analog input terminal 5 to the digital circuit 2 via an A/D converter 3, and an analog output is output to the outside from an analog output terminal 6 via a D/A converter 4.

In this embodiment, the objects of the test by a digital LSI tester are the A/D converter 3 and the D/A converter 4. The test for the digital circuit 2 may be performed in accordance with the conventional testing method for the digital circuit by using the digital tester.

The first embodiment of the mixed analog/digital integrated circuit 1 of this invention has a configuration in which all means necessary for testing the A/D converter 3 and the D/A converter 4 are provided as additional circuits outside of the digital circuit 2.

The additional circuits are constituted of a digital waveform generator 7, a digital multiplexer 8, an attenuator 9 with attenuation factor α of 0.5, a first analog multiplexer 10, a second analog multiplexer 11, a digital multiplier 12 having a multiplying factor of 2 which is equal to the reciprocal of the attenuation factor α, a digital multiplexer 13 and a comparator circuit 14. These additional circuits are provided with an analog test enable terminal (ATE) 15, a test mode switching terminal (ATM) 16 and a comparator output terminal 17 which outputs the output signal of the comparator circuit 14 to the outside, for the control of the above-mentioned circuits. Further, a clock from a clock input terminal 18 is used at the both time of the normal operation and the test operation.

Next, an outline of the procedure of the testing method for the first embodiment of the mixed analog/digital integrated circuit of this invention will be described.

First, the ATM 16 is turned off to set the first analog multiplexer 10 to pass the output signal of the D/A converter 4 directly, and set at the same time the digital multiplexer 13 to pass output signal of the A/D converter 4 directly. Further, the ATE 15 is turned on to set the second analog multiplexer 11 to pass the analog signal from the first analog multiplexer 10, and set at the same time the digital multiplexer 8 to pass the digital signal from the digital waveform generator 7.

By so doing, the signal generated by the waveform generator 7 is input to the D/A converter 4. The signal from the D/A converter 4 is sent to the A/D converter 3 via the first analog multiplexer 10 and the second analog multiplexer 11.

Further, the converted digital signal by the A/D converter 3 is supplied to one of the input terminals of the comparator circuit 14 via the digital multiplexer 13.

On the other hand, the signal generated by the digital waveform generator 7 is supplied directly to the other input terminal of the comparator circuit 14, so that a comparison result signal is output from the comparator circuit 14 in accordance with the agreement or disagreement of the signals at both input terminals, and is then transmitted to the output terminal 17.

The number of the clock signals supplied to the clock input terminal 18 up to a predetermined pattern number is counted on the digital tester side, and then the result of the first test is considered as a good result if no H level signal is output from the output terminal 17 during that first test period. Namely, the reversibility of the A/D converter 3 and the D/A converter 4 is verified.

Next, the ATM 16 is turned on to set the first analog multiplexer 10 to pass the output signal from the attenuator 9 with attenuation factor 0.5, and at the same time set the digital multiplexer 13 on the output side of the two-fold digital multiplier 12. By so doing, the signal generated by the digital waveform generator 7 is supplied via the digital multiplexer 8 to the D/A converter 4 for converting to an analog signal. Then, the converted signal is attenuated to ½ by the attenuator 9, and then is sent to the A/D converter 3 via the first analog multiplexer 10 and the second analog multiplexer 11 to convert back to a digital signal by the A/D converter 3, and after shifted to the most significant bit (MSB) side by one bit by the two-fold digital multiplier 12, then it is supplied to one of the input terminals of the comparator circuit 14 via the digital multiplexer 13.

On the other hand, the signal generated by the digital waveform generator 7 is supplied directly to the other input terminal of the comparator circuit 14 so that a comparison result from the comparator 14 in accordance with agreement or disagreement between the signals at both input terminals is transmitted to the output terminal 17. After counting, on the digital tester side, the number of clock signals supplied to the clock input terminal 18 up to the predetermined pattern number, it is decided that the specimen has passed the second test if no H level signal is output from the output terminal 17 during that test period. In other words, the linearity of the A/D converter 3 and the D/A converter 4 is verified simultaneously. Finally, the ATE 15 is turned off to set the analog multiplexer to pass the input signals from the terminal 5 to the A/D converter 3 and to set the digital multiplexer to pass the signal from the digital circuit 2 to the D/A converter 14. The test process for the analog part of this circuit, namely, the A/D converter 3 and the D/A converter 4 is completed.

Next, the second embodiment of the mixed analog/digital integrated circuit of this invention will be described.

Figure 2:
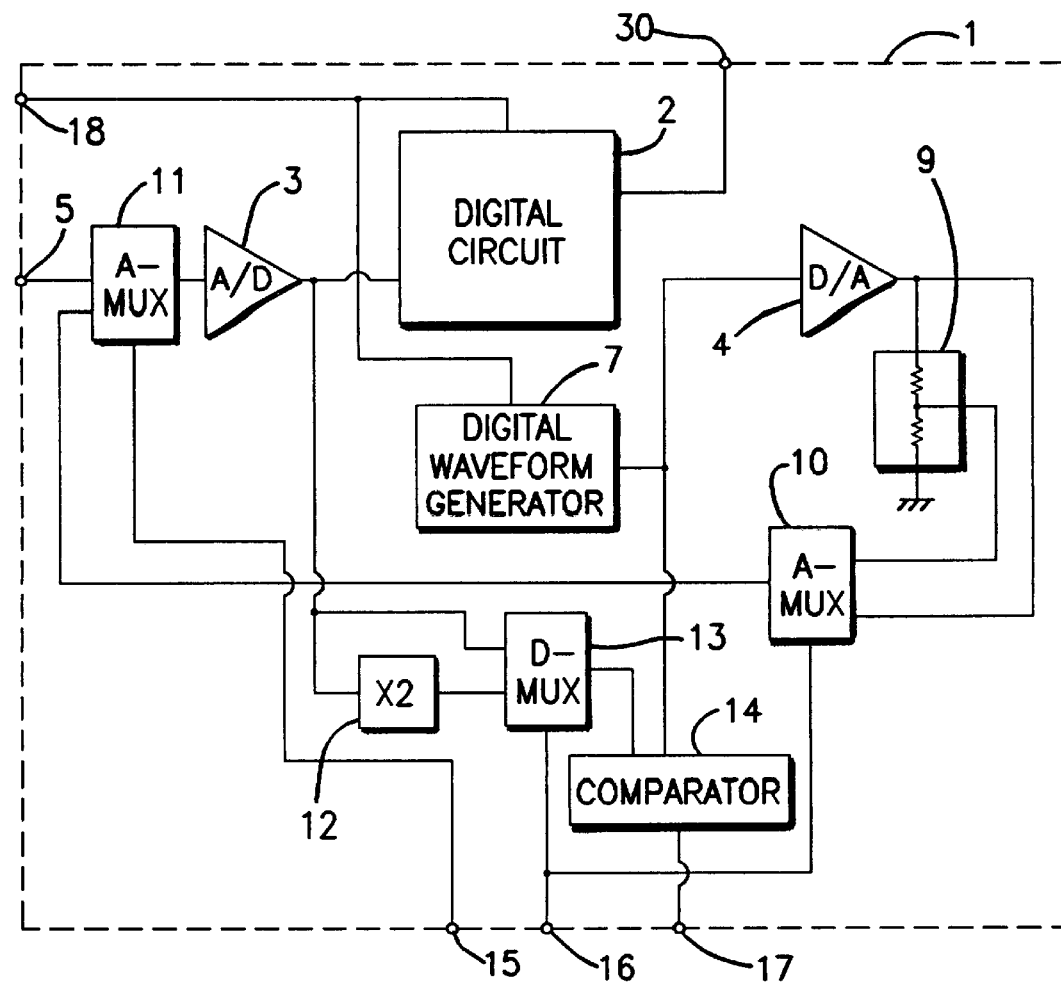
FIG. 2 is a block diagram showing a second embodiment of the mixed analog/digital integrated circuit arranged for the test of the invention.

Referring to FIG. 2, this embodiment is an integrated circuit in which all processings in the integrated circuit 1 are performed by a digital circuit 2, according to an analog input from the terminal 5 via A/D converter 3. And the digital output from the circuit 2 is transferred to the outside through the terminal 30.

In this embodiment, the integrated circuit 1 output only the digital signal from the digital circuit 2 to the terminal 19, so that there is no need to convert the digital signal to the analog signal.

Therefore, the object of the test by the digital LSI tester is the A/D converter 3. Since the remaining component is only the digital circuit 2, the test for it needs only be performed in accordance with the conventional testing procedure of the digital circuit using the digital tester, analogous to the case of the first embodiment.

The second embodiment of the mixed analog/digital integrated circuit of this invention has a constitution in which all means necessary for the test of the A/D converter 3 are provided as an additional circuits to the digital circuit 2. In other words, this additional circuits are constituted of a digital waveform generator 7, a D/A converter 4, an attenuator 9 with attenuation factor α of 0.5, a first analog multiplexer 10, a second analog multiplexer 11, a digital multiplier 12 having a multiplying factor equal to the reciprocal of the attenuation factor α, a digital multiplexer 13 and a comparator circuit 14. In addition, an analog test enable terminal (ATE) 15, a test mode switching terminal (ATM) 16 and a comparator output terminal 17 for outputting the output of the comparator circuit 14 to the outside are provided to control these circuits. A clock from the terminal 18 is used at the both time of normal operation and the test operation.

Since the outline of the testing procedure for this embodiment is identical to that of the first embodiment, a detailed description of the procedure will be omitted.

Next, the third embodiment of the mixed analog/digital integrated circuit of this invention will be described.

Figure 3:
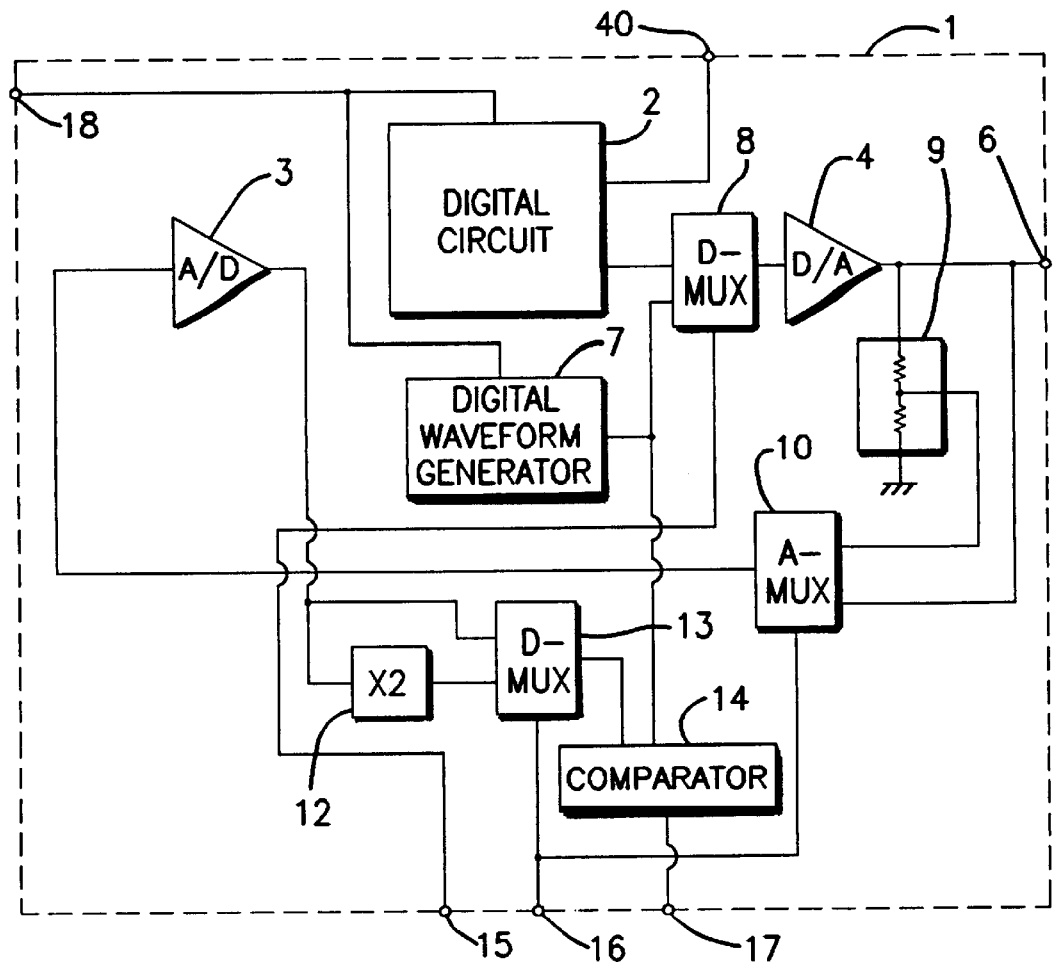
FIG. 3 is a block diagram showing a third embodiment of the mixed analog/digital integrated circuit arranged for the test of the invention.

Referring to FIG. 3, this embodiment of the mixed analog/digital integrated circuit is an integrated circuit in which all processings in an integrated circuit 1 are performed by a digital circuit 2 according to the digital input signal from the terminal 40, so that there is no need to convert the input analog signal to the digital signal for the digital circuit 2.

In this embodiment, thus the object of the test by the digital LSI tester is the D/A converter 4. Since the remaining component is only the digital circuit 2, the test for it needs be performed in accordance with the conventional testing procedure for the digital circuit by the digital tester, analogous to the cases of the first and the second embodiments.

The third embodiment of the mixed analog/digital integrated circuit of this invention has, in addition to the digital circuit 2, a digital waveform generator 7, a digital multiplexer 8 for signal source switching, an attenuator 9 with attenuation factor α of 0.5, a first analog multiplexer 10, an A/D converter 3, a digital multiplier 12, a digital multiplexer 13 and a comparator circuit 14, as the necessary means for testing the D/A converter 4. In addition, it is provided with an analog test enable terminal (ATE) 15, a test mode switching terminal (ATM) 16 and a comparator output terminal 17 for outputting the output of the comparator circuit 14 to the outside, to control these circuits. A clock from the terminal 18 is used at the both time of normal operation and the test operation.

Since the procedural outline of the testing method for this embodiment is identical to that of the testing method of the first or the second embodiment, a detailed description of the procedure will be omitted.

Next, the fourth embodiment of the mixed analog/digital integrated circuit of this invention will be described.

Figure 4:
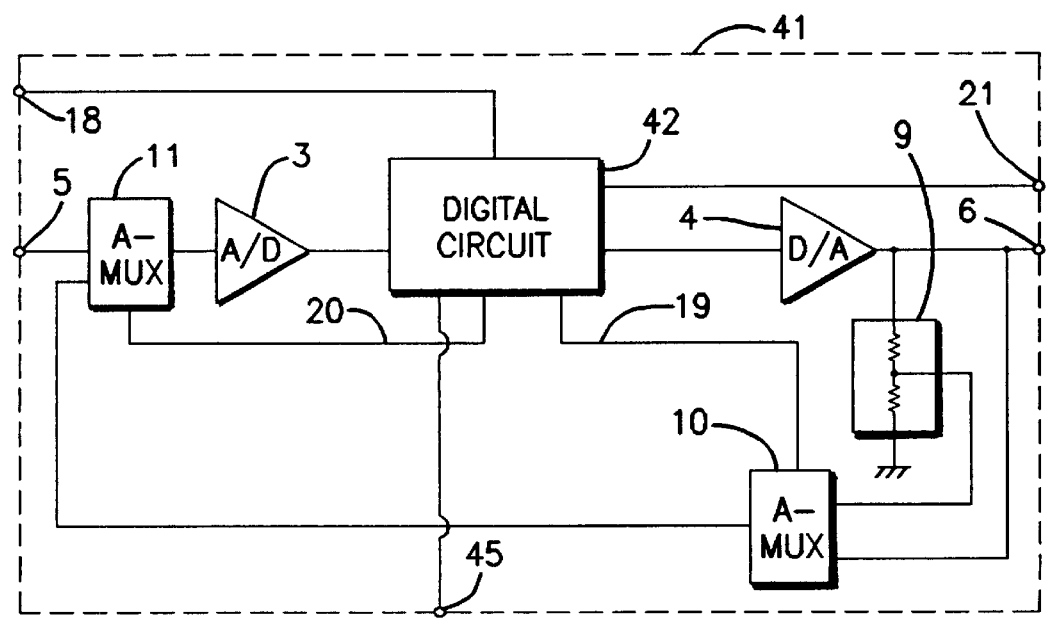
FIG. 4 is a block diagram showing a fourth embodiment of the mixed analog/digital integrated circuit arranged for the test of the invention.

Referring to FIG. 4, the mixed analog/digital integrated circuit 41 of this embodiment has a constitution in which the digital waveform generator 7, the digital multiplexers 8 and 13, the multiplier 12, the comparator circuit 14 and the digital circuit 2 that are digitally processable among the components of the first embodiment of the mixed analog/digital integrated circuit are integrated into one digital circuit 42.

The digital circuit 42 of this embodiment is composed of a cell-based application specific integrated circuit (ASIC) on which are mounted highly advanced digital macros such as CPU macro block or memory macro block. Because of that, it is possible to suppress the scale of the additional circuit of the first embodiment to a minimum level.

The analog/digital integrated circuit 41 is further provided with an analog test enable terminal (ATE) 45. The digital circuit detects whether or not an analog test is to be made by monitoring the turning-on or -off of the ATE 45.

As a clock for the test, a test clock supplied to the digital circuit 42 from a clock input terminal 18 or a clock signal newly generated for test within the digital circuit 42 is used, depending upon the specifications of the test for the digital circuit 42.

Next, an outline of the procedure for the testing method of this embodiment will be described.

First, the ATE 45 is turned so that the digital circuit 42 detects that it to be in the analog test mode. Upon receipt of this signal the digital circuit 42 executes the test sequence according to a program pre-set in a memory macro block (not shown) within the digital circuit 42 by using a CPU macro thereof. According to the program, first, a switching signal 20 is turned on to set the second analog multiplexer 11 to pass the output signal from the first analog multiplexer 10 to the A/D converter 3. Next, a switching signal 19 is turned off to set the first analog multiplexer 10 to pass the output signal from the D/A converter 4 to the second multiplexer 11.

Next, the digital waveform generator 7 generates a series of test signals to the D/A converter 4 according to the instructions from the CPU that is controlled by the test data and a test signal generating control program stored within a memory macro block. After conversion the test signal to an analog signal by the D/A converter 4, the test signal is sent to the A/D converter 3 via the first analog multiplexer 10 and the second analog multiplexer 11. Further, it is reconverted to a digital signal by the A/D converter 3, and then the output signal thereof is input to the comparator 14 within digital circuit 42 to be compared with the signal from the digital waveform generator 7 and then the result of the comparison is output to the outside from a digital output terminal 21 as a report.

The digital LSI tester makes modification of the subsequent test sequence thereafter depending upon the contents of the report.

If the IC passes the series of tests according to the program, the switching signal 19 to the first analog multiplexer 10 is turned on to switch the input signal to the first analog multiplexer 10 to the output signal of the attenuator 9.

Next, a series of test signals are input to the D/A converter 4 by the same manner described above. The converted analog signal by the D/A converter 4 is sent to the A/D converter 3 via the attenuator 19, the first analog multiplexer 10 and the second analog multiplexer 11 to reconvert to a digital signal.

The signal from the A/D converter is doubled by means of an arithmetic and logic unit (ALU) block (not shown) in a CPU macro block by a shift left (SHL) instruction and then it is compared with the from the digital waveform generator 7. The result of the comparison is output to the outside from the digital output terminal 21 as a report. Upon receipt of the output report, the digital tester makes a decision whether or not the product under the test is good. With the passage of this series of tests, the analog test is completed.

The feature of this embodiment is that the constitution of the additional circuit other than the digital circuit 42 is given a minimum scale, and the number of the additional pin is just one of the ATE 45, so that the influence on the constitution of the semiconductor chip is extremely slight.

Figure 5:
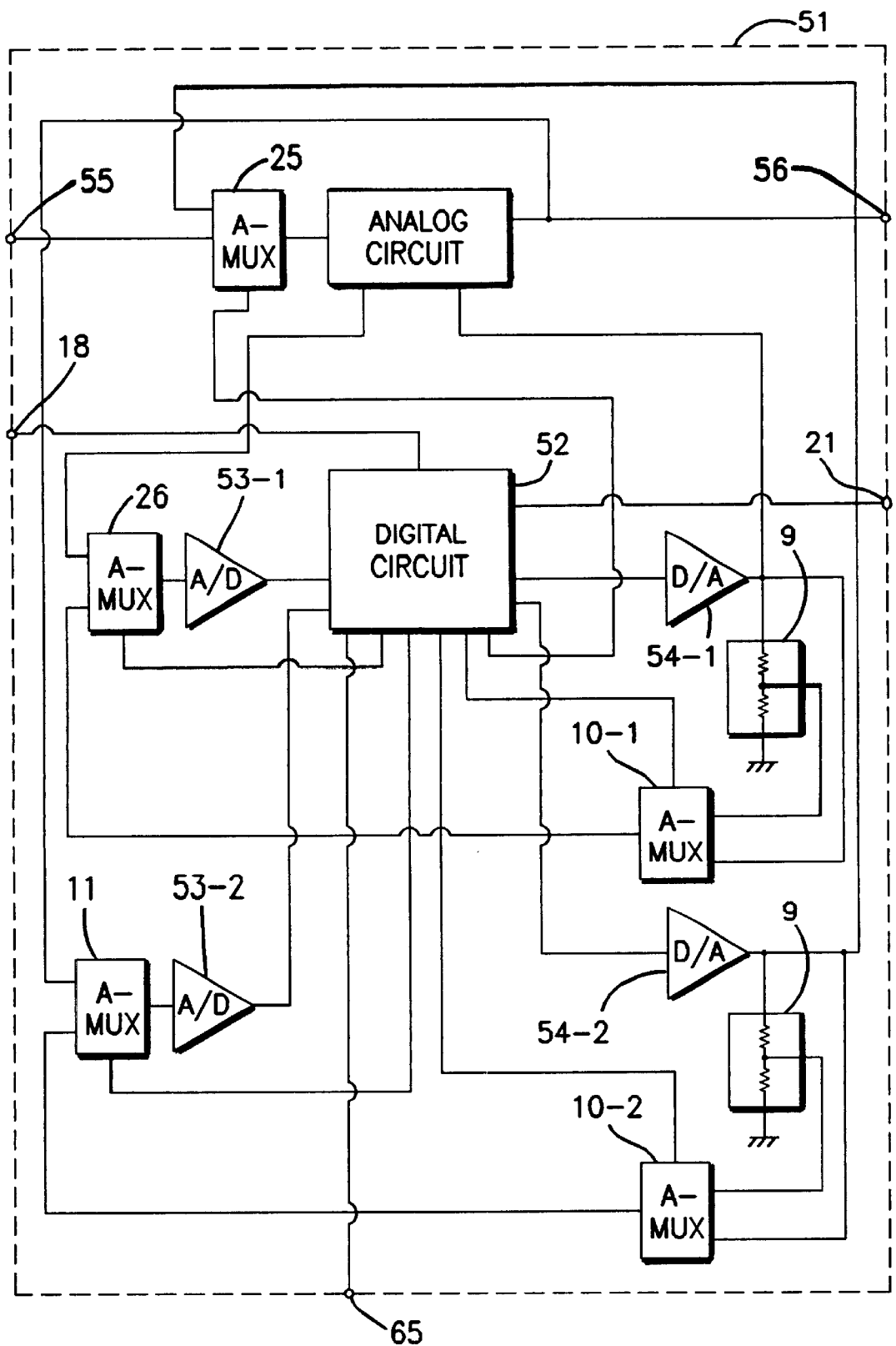
FIG. 5 is a block diagram showing a fifth embodiment of the mixed analog/digital integrated circuit arranged for the test of the invention.
Figure 6:
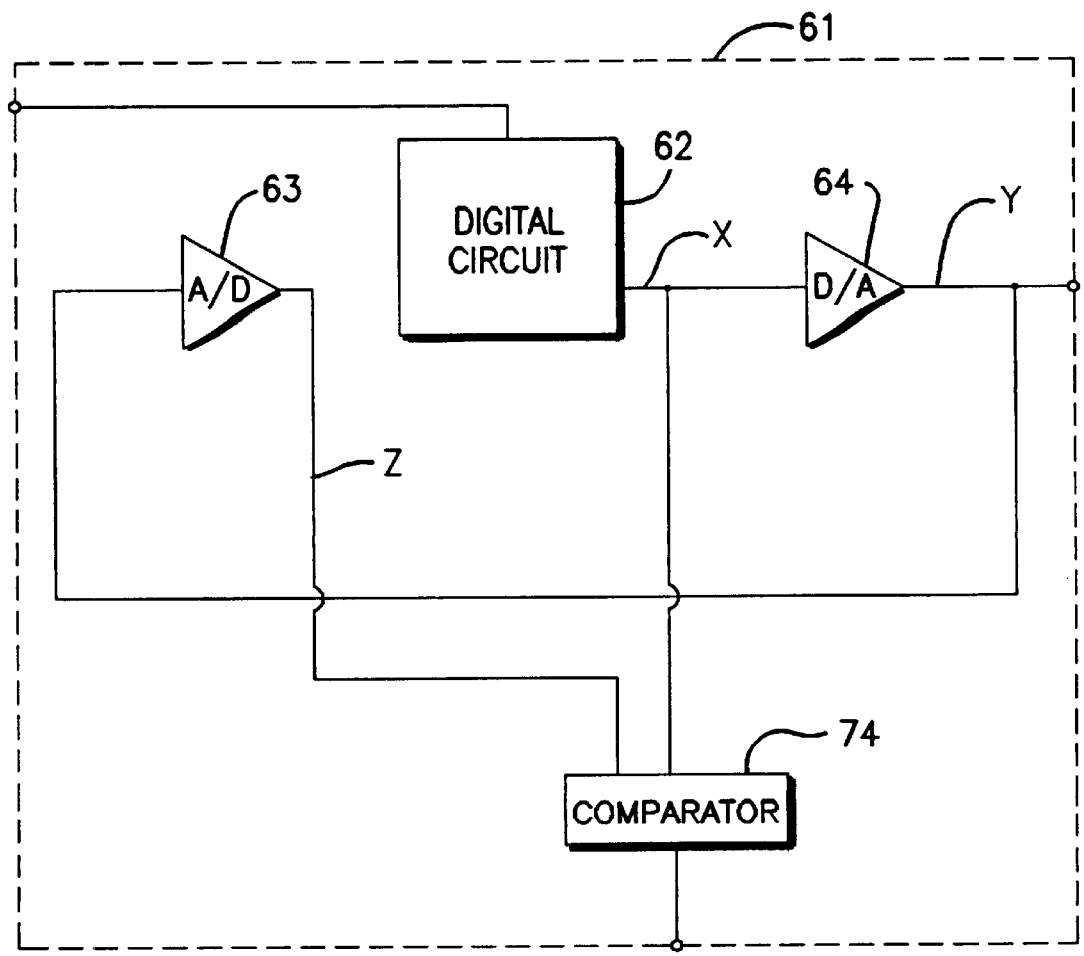
FIG. 6 is a block diagram showing a prior art mixed analog/digital integrated circuit.

Next, referring to FIG. 5, the fifth embodiment of the mixed analog/digital integrated circuit 51 of this invention will be described. This integrated circuit 51 includes an analog circuit 22, a digital circuit 52 and a D/A converter 54-1 and a D/A converter 53-1 for signal conversion between the analog circuit 22 and the digital circuit 52. An analog circuit 22 has several functions except for A/D and D/A converting functions and operates according to an analog input from a input terminal 55 via an analog multiplexer 25 and an output signal from the digital circuit 52 via D/A converter 54-1. The digital circuit 52 operates according to an output signal from the analog circuit 22 via an analog multiplexer 26 and the D/A converter 53-1 and output digital signal to the D/A converter 54-1. The mixed analog/digital integrated circuit 51 further includes a D/A converter 54-2 and an A/D converter 53-2 which are additional elements needed for testing the whole function of the mixed analog/digital integrated circuit 51 by using a digital tester. The digital circuit 52 includes a digital waveform generator, digital multiplexers, a multiplier, a comparator and a test sequence control program like as them described in the forth embodiment, which are used for testing the A/D converters 53-1,2 and D/A converters 54-1,2 and the whole functions of integrated circuit 51. The digital circuit 52 further includes a emulator for emulating analog input signal from the input terminal 55.

The test of A/D and D/A converters is carried out for each pare of (A/D 53-1, D/A 54-1) and (A/D 53-2, D/A 54-2) by using the method described in the forth embodiment.

After the test of all pares of A/D and D/A converters, then the test of whole functions of the integrated circuit 51 is carried out as the following.

First, the analog multiplexer 25 is set to pass the output signal from the D/A converter 54-2, the analog multiplexer 11 and 26 are set to pass the respective output signals from the analog circuit 22 under the control of the program stored in digital circuit 52.

Then, the emulator in the digital circuit 52 emulates input signal to the D/A converter 54-2. The analog circuit operates according to the output signal from the D/A converter 54-2 and output the output signal thereby to the digital circuit 52 via the A/D converter 53-1. The digital circuit 52 output the digital signal according to the output signal from the A/D converter 53-1 to the D/A converter 54-1 which sends a converted signal to the analog circuit 22. The output signal from the analog circuit 22 is transferred to the digital circuit 52 via the A/D converter 53-2. Then, the transferred digital signals are compared with the expected values stored in the memory in the digital circuit 52. The digital circuit 52 output the comparison signal to the outside via the terminal 21 according to whether or not both the value coincide with each other. Thus, the test of the whole function of the mixed analog/digital circuit is carried by using the digital tester only.

The test procedure mentioned above is controlled by the program stored in the memory in the digital circuit 52.

In the above embodiment, the analog circuit 22 has a single input signal from external input terminal 55 and a single output signal to external output terminal 56 so that the number of the additional D/A converter (54-2) associated with the input signal 55 is one and the number of the additional A/D converter (53-2) associated with the output signal 56 is one. When the analog circuit has a plurality of input signals from the outside and a plurality of output signals to the outside, the number of the additional D/A converters is equal to the number of input signals and the number of the A/D converters is equal to the number of the output signals.

The conventional technique as the testing method for the general mixed analog/digital integrated circuit is disclosed in Japanese Patent Application Laid Open No. 2-19780 (1990). This is a test method by which the test for the digital part is carried out using a digital tester and the test for the analog part is carried out separately using an analog tester, and is not one based on a test method which emulates an intrinsic analog input from the outside (referred to as mission Ain in the conventional technique) from the digital circuit side, and a test method which analyzes an intrinsic analog output to the outside (referred to as mission Aout in the conventional technique) by taking it into the digital circuit side. For this reason, this invention is the first realization of a method which performs all the tests by using a digital tester alone.

In the description of this embodiment, the method of inputting information for forming a signal which emulates an analog input signal to the digital circuit side from the outside has not been described in detail. However, a general technique for facilitating the test of a digital circuit, such as a method using scan chain or boundary scan, can obviously be used along with the circuit constitution and the testing technique of this invention. Therefore, it is obvious that the concurrent application of such a technique falls naturally within the scope of this invention as long as this invention is adopted relative to the test technique of the analog part.

Moreover, the amplification factor of the A/D converter and the D/A converter has not been touched upon in this and other embodiments. However, the reason for this is simply that in either case the verification of the amplification factor can readily be accomplished by carrying out a comparison processing which uses a reference voltage, and it is apparent that the lack of the mention of this matter should not influence in any way the scope of this invention.

As described in the above, this invention overcomes the disadvantage of the conventional testing method (Japanese Patent Application Laid Open No. 1-139478 (1989)) for a digital circuit having a D/A converter by means of a digital tester alone can handle only the test of the D/A converter, and is able to verify only the reversibility with an A/D converter installed for testing purposes. Moreover, this invention can extends the verification of the reversility to the D/A converter, too, and can verify simultaneously the linearity of the A/D converter and the D/A converter. Therefore, this invention enables a complete tests of a general mixed analog/digital integrated circuit by the use of a single LSI tester.

Accordingly, this invention has the effects of facilitating the tests of a mixed analog/digital integrated circuit by an operator who is unskilled in the analog circuit field in an inexpensive digital testing environment with many working equipment, and promoting reduction of the testing time and the testing cost and design for simplification of the tests.

While this invention has been described in connection with certain preferred embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

What is claimed is:

1. A test method for a mixed analog/digital integrated circuit including a digital circuit, an A/D converter for converting an analog input signal from an external input terminal to a converted digital signal to said digital circuit and a D/A converter for converting a digital output signal from said digital circuit to a converted analog signal to an external output terminal, said digital circuit operates according to said converted digital signal, said test method comprising the steps of:

disconnecting said D/A converter from said digital circuit;
disconnecting said A/D converter from said external input terminal and said digital circuit;
converting a series of sample digital signals to a first analog signal by said D/A converter;
converting said first analog signal to a series of first digital signals by said A/D converter;
comparing whether or not said series of said first digital signals coincides with said series of said sample digital signals;
attenuating said first analog signal by a predetermined attenuation factor to obtain a second analog signal;
converting said second analog signal to a series of second digital signals by said A/D converter;
multiplying said series of second digital signals by a multiplying factor equal to the reciprocal of said predetermined attenuation factor to obtain a series of third digital signals; and
comparing whether or not said series of said third digital signals coincides with said series of said sample digital signals.

2. The test method as claimed in claim 1, wherein said series of said sample digital signals are generated by a digital waveform generator being included in said mixed analog/digital circuit for an interval of a predetermined number of clocks.

3. A test method for a mixed analog/digital integrated circuit including a digital circuit, an A/D converter and a D/A converter, comprising the steps of:
   converting a series of sample digital signals to a first analog signal by said D/A converter;
   converting said first analog signal to a series of first digital signals by said A/D converter;
   comparing whether or not said series of said first digital signals coincides with said series of said sample digital signals;
   attenuating said first analog signal by a predetermined attenuation factor to obtain a second analog signal;
   converting said second analog signal to a series of second digital signals by said A/D converter;
   multiplying said series of second digital signals by a multiplying factor equal to the reciprocal of said predetermined attenuation factor to obtain a series of third digital signals; and
   comparing whether or not said series of said third digital signals coincides with said series of said sample digital signals.

4. The test method as claimed in claim 3, wherein said series of said sample digital signals are generated by a digital waveform generator being included in said mixed analog/digital integrated circuit for an interval of predetermined number of clocks.

5. The test method as claimed in claim 3, wherein said D/A converter is for converting a series of digital signals from said digital circuit to an analog signal to an external analog output terminals.

6. The test method as claimed in claim 3, wherein said A/D converter is for converting an analog signal from an external analog input terminal to a series of digital signals as input signals for said digital circuit.

7. The test method for a mixed analog/digital integrated circuit including a digital circuit, an analog circuit having functions except for D/A and A/D conversion, a first D/A converter and an first A/D converter for signal conversion between said digital circuit and said analog circuit, said analog circuit receiving an analog signal from an external input terminal and outputting an analog signal to an external output terminal, said mixed analog/digital integrated circuit further including a second D/A converter and a second A/D converter for using for test of said mixed analog/digital circuit, said test method comprising the steps of:
   (A) testing the conversion reversibility and linearity between said first D/A converter and said first A/D converter;
   (B) testing the conversion reversibility and linearity between said second D/A converter and said second A/D converter; and
   (C) testing said whole functions of said mixed analog/digital integrated circuit.

8. The test method claimed in claim 7, wherein each of said testing the conversion reversibility and linearity (A), (B) comprising the steps of:
   converting a series of sample digital signals to a first analog signal by an associated D/A converter;
   converting said first analog signal to a series of first digital signals by an associated A/D converter;
   comparing whether or not said series of said first digital signals coincides with said series of said sample digital signals;
   attenuating said first analog signal by a predetermined attenuation factor to obtain a second analog signal;
   converting said second analog signal to a series of second digital signals by said A/D converter;
   multiplying said series of second digital signals by a multiplying factor equal to the reciprocal of said predetermined attenuation factor to obtain a series of third digital signals; and
   comparing whether or not said series of said third digital signals coincides with said series of said sample digital signals.

9. The test method as claimed in claim 8, wherein said series of said sample digital signals are generated by a digital waveform generator being included in said mixed analog/digital integrated circuit for an interval of predetermined number of clocks.

10. The test method claimed in claim 7, wherein said testing (C) comprising the steps of:
   arranging circuit connection so that said second D/A converter being connected between an output of said digital circuit and an input of said analog circuit and said second A/D converter being connected between an output of said analog circuit and an input of said digital circuit;
   inputting test signals to said second D/A converter; and
   comparing output signals from second A/D converter with expected values predetermined.

11. The test method claimed in claim 10, wherein said test signals are emulation signals of said input signal from said external input terminal and generated by an emulator included in said mixed analog/digital integrated circuit.

* * * * *